United States Patent
Chen et al.

(10) Patent No.: US 6,461,966 B1
(45) Date of Patent: Oct. 8, 2002

(54) METHOD OF HIGH DENSITY PLASMA PHOSPHOSILICATE GLASS PROCESS ON PRE-METAL DIELECTRIC APPLICATION FOR PLASMA DAMAGE REDUCING AND THROUGHPUT IMPROVEMENT

(75) Inventors: Yao-Hsiang Chen, Hsin-Chu (TW); Chu-Yun Fu, Taipei (TW); Syung-Ming Jang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/017,954

(22) Filed: Dec. 14, 2001

(51) Int. Cl.[7] .............................................. H01L 21/311
(52) U.S. Cl. ....................... 438/695; 438/697; 438/699; 438/702; 438/703; 438/435
(58) Field of Search ................................. 438/695, 697, 438/699, 702, 703, 435

(56) References Cited

U.S. PATENT DOCUMENTS

| | | | |
|---|---|---|---|
| 5,920,792 A | * | 7/1999 | Lin ............................. 438/633 |
| 5,968,610 A | | 10/1999 | Liu et al. ..................... 427/579 |
| 6,013,584 A | | 1/2000 | M'Saad ........................ 438/783 |
| 6,211,040 B1 | | 4/2001 | Liu et al. ..................... 438/424 |
| 6,291,030 B1 | * | 9/2001 | Chao et al. .................. 427/569 |
| 6,339,027 B1 | * | 1/2002 | Chok .......................... 438/692 |

* cited by examiner

*Primary Examiner*—Trung Dang
(74) *Attorney, Agent, or Firm*—George O. Saile; Stephen B. Ackerman

(57) ABSTRACT

A method of forming a composite dielectric layer comprising the following steps. A structure having at least two semiconductor structures separated by a gap therebetween is provided. A first dielectric layer is formed over the structure, the two semiconductor structures and within the gap between the two semiconductor structures to a thickness as least as high as the top of the semiconductor structures by a first high density plasma (HDP) process. The first HDP process having a first high bias RF power, a low first deposition: sputter ratio and a first chucking bias voltage. A second dielectric layer is then formed over the first dielectric layer by a second HDP process to form the composite dielectric layer. The second HDP process having: a second bias RF power that is less than the first bias RF power; a second deposition: sputter ratio that is greater than the first deposition: sputter ratio; and a second chucking bias voltage that is zero.

40 Claims, 1 Drawing Sheet

METHOD OF HIGH DENSITY PLASMA PHOSPHOSILICATE GLASS PROCESS ON PRE-METAL DIELECTRIC APPLICATION FOR PLASMA DAMAGE REDUCING AND THROUGHPUT IMPROVEMENT

FIELD OF THE INVENTION

The present invention relates generally to semiconductor fabrication and more specifically to high density plasma (HDP) pre-metal dielectric (PMD) layer deposition processes.

BACKGROUND OF THE INVENTION

The use of high density plasma (HDP) phosphosilicate glass (PSG) in the formation of pre-metal dielectric (PMD) layers raises the concerns of plasma damage. For gap-fill purposes in dealing with relatively closely spaced structures, a high bias power with low deposition: sputter (D:S) ratio is used along with a chucking bias voltage on an E-chuck (electrical chuck) for temperature control. However, the high bias power, low D:S ratio and chucking voltage all create the potential for plasma damage to the device wafer. For example, plasma damage to the structures and damage to gate oxide from the process is common.

U.S. Pat. No. 6,211,040 B1 to Liu et al. describes an HDP CVD silicon dioxide two-step deposition process to reduce plasma damage in very small feature applications. A gas mixture is used that is comprised of silane, oxygen and argon.

U.S. Pat. No. 5,968,610 to Liu et al. describes a method for depositing dielectric material into gaps between wiring lines that includes the deposition of three oxide layers using a HDP CVD.

U.S. Pat. No. 6,013,584 to M'Saad describes a process of forming a dielectric layer, such as PSG, that exhibits low moisture content, good gap fill capability, good gettering capability and compatibility with planarization techniques.

SUMMARY OF THE INVENTION

Accordingly, it is an object of one or more embodiments of the present invention to provide a method of reducing HDP PSG plasma damage while achieving good gap filling.

Another object of one or more embodiments of the present invention to provide a method of increasing HDP PSG throughput while also reducing plasma damage with good gap filling.

Other objects will appear hereinafter.

It has now been discovered that the above and other objects of the present invention may be accomplished in the following manner. Specifically, a structure having at least two semiconductor structures separated by a gap therebetween is provided. A first dielectric layer is formed over the structure, the two semiconductor structures and within the gap between the two semiconductor structures to a thickness as least as high as the top of the semiconductor structures by a first high density plasma (HDP) process. The first HDP process having a first high bias RF power, a low first deposition: sputter ratio and a first chucking bias voltage. A second dielectric layer is then formed over the first dielectric layer by a second HDP process to form the composite dielectric layer. The second HDP process having: a second bias RF power that is less than the first bias RF power; a second deposition: sputter ratio that is greater than the first deposition: sputter ratio; and a second chucking bias voltage that is zero.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Key Features of the Invention

Two key features of the present invention is to separate the HDP PSG deposition process into two distinct steps. The first step deposits a first layer at least as thick as the overlying structures on the meets the gap fill requirements, i.e. to fill the gaps between adjacent structures. The first step deposits the first layer with a high bias power, a low deposition: sputter (D:S) ratio and a chucking bias voltage on an E-chuck. After the first layer is deposited to a thickness just sufficient to cover the overlying structures to minimize plasma damage due to ion bombardment, a second step is used to deposit a second layer sufficiently thick for a subsequent planarization, preferably by chemical mechanical polishing (CMP).

Another key feature of the invention is to tune the bias power to fit the process temperature used. This permits control or a lower thermal budget for overall process integration.

Initial Structure

Figure 1:
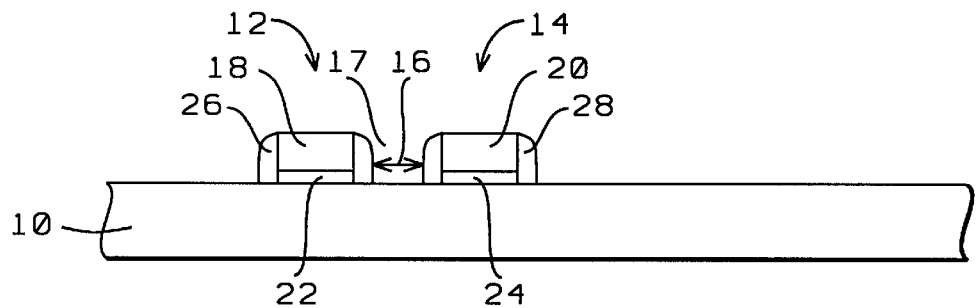
FIGS. 1 to 3 schematically illustrate a preferred embodiment of the present invention.

As shown in FIG. 1, starting structure 10 includes at least two adjacent structures 12, 14 separated by gap 17 having a width 16. Structures 12, 14 may be separated by as little as from about 80 to 150 Å between structures 12, 14.

Structure 10 is preferably a semiconductor structure and is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Structures 12, 14 may be, for example, and as shown in the Figures, gates including respective: poly gates 18, 20 overlying gate oxide portions 22, 24; and sidewall spacers 26, 28. The other details of the poly gates 18, 20 such as source/drain implants are not shown. As shown in the Figures, structure 10 is a silicon substrate.

First PMD Layer 30 Deposition

Figure 2:
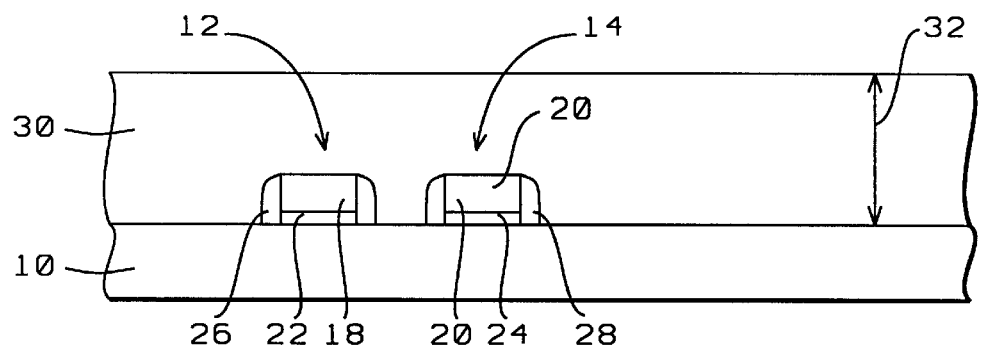

As shown in FIG. 2, a first pre-metal dielectric (PMD) layer 30 is formed over silicon substrate 10 and gate structures 12, 14 by a first HDP PSG process to a thickness 32 to at least cover gate structures 12, 14 and preferably, for example, a thickness 32 of from about 1800 to 2200 Å and more preferably about 2000 Å. First PMD layer 30 is comprised of preferably phosphosilicate glass (PSG) or undoped silica glass (USG) and more preferably PSG.

The first HDP PSG process is conducted at a high bias power for gap filling purposes, a low D:S ratio, with a chucking bias voltage implemented on an E-chuck consistent with conventional HDP PSG process parameters.

The first HDP PSG process has a relatively low deposition rate to achieve maximum gap fill capability between adjacent gate structures 12, 14, e.g. This high gap fill capability comes with the attendant high potential of plasma damage to structures 12, 14 and to gate oxide portions 22, 24 so, in one key step of the invention the first HDP PSG process is halted once the minimum thickness of PMD layer 30 is achieved, i.e. when gap 17 between poly gate sidewall spacers 26, 28 is filled with PMD material of PMD layer 30 and PMD layer 30 is as least as thick as poly gates 18, 20 extend from silicon substrate 10.

Second PMD Layer 40 Deposition

Figure 3:
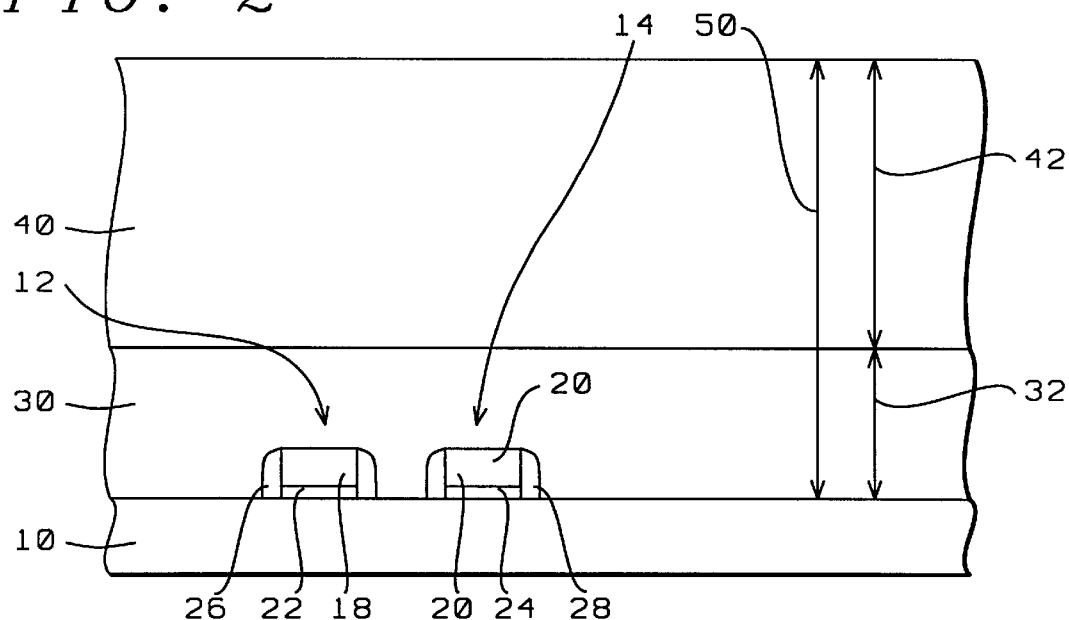

In another key step of the invention and as shown in FIG. 3, second PMD layer 40 is formed over first PMD layer 30 by a second HDP PSG process to a thickness 42 sufficient for a subsequent planarization of second PMD layer 40 and is preferably, for example, from about 6750 to 8250 Å thick and more preferably about 7500 Å thick to achieve a total first and second PMD layer 30, 40 thickness of preferably, for example, about 8550 to 10,450 Å thick and more preferably about 9500 Å thick. Second PMD layer 40 is comprised of the same material comprising first PMD layer 30 and is comprised of preferably phosphosilicate glass (PSG) or undoped silica glass (USG) and more preferably PSG.

The second HDP PSG process is conducted at a low bias power tuned to the process temperature and a high D:S ratio with chuck off, i.e. with no chucking bias voltage implemented on the E-chuck. The second HDP PSG process is also conducted without a backside cooling.

Tuning the bias power to fit the second HDP PSG process temperature is important for the PSG film/layer 40 properties and for the thermal budget control. It is noted that the first HDP PSG process temperature is tuned by backside He cooling. The process temperature of the first and second HDP PSG processes are preferably the same, i.e. a consistent temperature is used for both the first and second HDP PSG processes.

The low bias power of the second HDP PSG process reduces the potential of plasma damage to structures 12, 14 and to gate oxide portions 22, 24. Further, the absence of chucking voltage on the E-chuck reduces electrical stress on gate oxide portions 22, 24 and thus reduces potential damage to gate oxide portions 22, 24. The high D:S ratio increases the second HDP PSG PMD layer 40 deposition rate and enhances the throughput.

The two step HDP PSG deposition method of the present invention changes the process temperature and impacts the film properties of the first and second PSG layers 30, 40 which preferably have a phosphorous concentration -[P] of about 3.5%. Since the E-chuck does not have a chucking voltage applied to it and without backside He cooling to decrease the second HDP PSG process temperature, a higher wafer temperature is achieved which allows the use of a low bias power for the second HDP PSG process sputter.

Tuning of the bias power to fit the process temperature of the second HDP PSG processes preserves the film properties of the second PMD layer 40 and is the same as the first HDP PSG process. Tuning the bias power to fit the process temperature permits control or a lower thermal budget for overall process integration.

Example Conducted by the Inventors

The following parameters are for a first deposition of first 2000 Å thick HDP PSG PMD layer 30 (Dep1) and a second deposition of second 7500 Å thick HDP PSG PMD layer 40 (Dep2) performed by the inventors. The example parameters shown below may be adjusted by one skilled in the art for varying process conditions and layers desired to be formed.

|  | Dep1 from about/more preferably | Dep2 from about/more preferably | Comments |
| --- | --- | --- | --- |
| Dep. Rate (Å/min) | 3060 to 3740/3400 | 4230 to 5170/4700 | 35% Reduction in Deposition time |
| Bias RF Power (W) | 2250 to 2750/2500 | 810 to 990/900 | Reduces Plasma Damage |
| E-Chuck Voltage (V) | 855 to 1045/950 | 0 | Reduces High Voltage Damage |
| Process Temp. (° C.) | 470 to 570/520 | 470 to 570/520 | Consistent Process Temperatures |

It is noted the method of the present invention may be used and adapted with other layers, for other gap filling processes and other processes where a CMP is conducted post deposition.

Advantages of the Present Invention

The advantages of one or more embodiments of the present invention include:

1. reducing the potential plasma damage on gate oxide that was due to HDP process; and
2. improve the wafer process throughput.

While particular embodiments of the present invention have been illustrated and described, it is not intended to limit the invention, except as defined by the following claims.

We claim:

1. A method of forming a composite dielectric layer, comprising the steps of:

providing a structure having at least two semiconductor structures separated by a gap therebetween;

forming a first dielectric layer over the structure, the two semiconductor structures and within the gap between the two semiconductor structures to a thickness as least as high as the top of the semiconductor structures by a first high density plasma (HDP) process; the first HDP process having a first high bias RF power, a low first deposition: sputter ratio and a first chucking bias voltage; and forming a second dielectric layer over the first dielectric layer by a second HDP process to form the composite dielectric layer; the second HDP process having: a second bias RF power that is less than the first bias RF power; a second deposition: sputter ratio that is greater than the first deposition: sputter ratio; and a second chucking bias voltage that is zero.

2. The method of claim 1, wherein the second dielectric layer has a thickness sufficient to permit a subsequent planarization of the second dielectric layer; and including the step of planarizing the second dielectric layer to form a planarized composite dielectric layer.

3. The method of claim 1, wherein the second dielectric layer has a thickness sufficient to permit a subsequent chemical mechanical polishing planarization of the second dielectric layer; and including the step of planarizing the second dielectric layer by chemical mechanical polishing to form a planarized composite dielectric layer.

4. The method of claim 1, wherein the first and second HDP processes are conducted at the same temperature.

5. The method of claim 1, wherein
the first HDP process is conducted at: a deposition rate of from about 3060 to 3740 Å/minute; a bias RF power of from about 2250 to 2750 W; a chucking bias voltage of from about 855 to 1045V; and a process temperature of from about 470 to 570° C.; and
the second HDP process is conducted at: a deposition rate of from about 4230 to 5170 Å/minute; a bias RF power of from about 810 to 990 W; a zero chucking bias voltage; and a process temperature of from about 470 to 570° C.

6. The method of claim 1, wherein
the first HDP process is conducted at: a deposition rate of about 3400 Å/minute; a bias RF power of about 2500 W; a chucking bias voltage of about 950V; and a process temperature of about 520° C.; and
the second HDP process is conducted at: a deposition rate of about 4700 Å/minute; a bias RF power of about 900 W; a zero chucking bias voltage; and a process temperature of from about 520° C.

7. The method of claim 1, wherein
the first HDP process is conducted at: a deposition rate of from about 3060 to 3740 Å/minute; a bias RF power of from about 2250 to 2750 W; a chucking bias voltage of from about 855 to 1045V; and a process temperature of from about 470 to 570° C. to form the first dielectric layer having a thickness of from about 1800 to 2200 Å; and
the second HDP process is conducted at: a deposition rate of from about 4230 to 5170 Å/minute; a bias RF power of from about 810 to 990 W; a zero chucking bias voltage; and a process temperature of from about 470 to 570° C. to form the second dielectric layer having a thickness of from about 6750 to 8250 Å.

8. The method of claim 1, wherein
the first HDP process is conducted at: a deposition rate of about 3400 Å/minute; a bias RF power of about 2500 W; a chucking bias voltage of about 950V; and a process temperature of about 520° C. to form the first dielectric layer having a thickness of about 2000 Å; and
the second HDP process is conducted at: a deposition rate of about 4700 Å/minute; a bias RF power of about 900 W; a zero chucking bias voltage; and a process temperature of from about 520° C. to form the second dielectric layer having a thickness of about 7500 Å.

9. The method of claim 1, wherein the first dielectric layer is from about 1800 to 2200 Å thick and the second dielectric layer is from about 6750 to 8250 Å thick.

10. The method of claim 1, wherein the first dielectric layer is about 2000 Å thick and the second dielectric layer is about 7500 Å thick.

11. The method of claim 1, wherein the first and second dielectric layers are comprised of the same material selected from the group consisting of PSG and USG.

12. The method of claim 1, wherein the first and second dielectric layers are comprised of PSG.

13. The method of claim 1, wherein the process temperature of the first and second HDP processes determine the value of the first HDP process bias RF power and the second HDP process bias RF power.

14. The method of claim 1, wherein the structure is a silicon substrate.

15. A method of forming a composite dielectric layer, comprising the steps of:
providing a structure having at least two semiconductor structures separated by a gap therebetween;
forming a first dielectric layer over the structure, the two semiconductor structures and within the gap between the two semiconductor structures to a thickness as least as high as the top of the semiconductor structures by a first high density plasma (HDP) process; the first HDP process having a first high bias RF power, a low first deposition: sputter ratio and a first chucking bias voltage; and
forming a second dielectric layer over the first dielectric layer by a second HDP process to form the composite dielectric layer; the second HDP process having: a second bias RF power that is less than the first bias RF power; a second deposition: sputter ratio that is greater than the first deposition: sputter ratio; and a second chucking bias voltage that is zero; wherein the first and second HDP processes are conducted at the same temperature.

16. The method of claim 15, wherein the second dielectric layer has a thickness sufficient to permit a subsequent planarization of the second dielectric layer; and including the step of planarizing the second dielectric layer to form a planarized composite dielectric layer.

17. The method of claim 15, wherein the second dielectric layer has a thickness sufficient to permit a subsequent chemical mechanical polishing planarization of the second dielectric layer; and including the step of planarizing the second dielectric layer by chemical mechanical polishing to form a planarized composite dielectric layer.

18. The method of claim 15, wherein
the first HDP process is conducted at: a deposition rate of from about 3060 to 3740 Å/minute; a bias RF power of from about 2250 to 2750 W; a chucking bias voltage of from about 855 to 1045 V; and a process temperature of from about 470 to 570° C.; and
the second HDP process is conducted at: a deposition rate of from about 4230 to 5170 Å/minute; a bias RF power of from about 810 to 990 W; a zero chucking bias voltage; and a process temperature of from about 470 to 570° C.

19. The method of claim 15, wherein
the first HDP process is conducted at: a deposition rate of about 3400 Å/minute; a bias RF power of about 2500 W; a chucking bias voltage of about 950V; and a process temperature of about 520° C.; and
the second HDP process is conducted at: a deposition rate of about 4700 Å/minute; a bias RF power of about 900 W; a zero chucking bias voltage; and a process temperature of from about 520° C.

20. The method of claim 15, wherein
the first HDP process is conducted at: a deposition rate of from about 3060 to 3740 Å/minute; a bias RF power of from about 2250 to 2750 W; a chucking bias voltage of from about 855 to 1045V; and a process temperature of from about 470 to 570° C. to form the first dielectric layer having a thickness of from about 1800 to 2200 Å; and the second HDP process is conducted at: a deposition rate of from about 4230 to 5170 Å/minute; a bias RF power of from about 810 to 990 W; a zero chucking bias voltage; and a process temperature of from about 470 to 570° C. to form the second dielectric layer having a thickness of from about 6750 to 8250 Å.

21. The method of claim 15, wherein the first HDP process is conducted at: a deposition rate of about 3400 Å/minute; a bias RF power of about 2500 W; a chucking bias voltage of about 950V; and a process temperature of about 520° C. to form the first dielectric layer having a thickness of about 2000 Å; and the second HDP process is conducted at: a deposition rate of about 4700 Å/minute; a bias RF power of about 900 W; a zero chucking bias voltage; and a process temperature of from about 520° C. to form the second dielectric layer having a thickness of about 7500 Å.

22. The method of claim 15, wherein the first dielectric layer is from about 1800 to 2200 Å thick and the second dielectric layer is from about 6750 to 8250 Å thick.

23. The method of claim 15, wherein the first dielectric layer is about 2000 Å thick and the second dielectric layer is about 7500 Å thick.

24. The method of claim 15, wherein the first and second dielectric layers are comprised of the same material selected from the group consisting of PSG and USG.

25. The method of claim 15, wherein the first and second dielectric layers are comprised of PSG.

26. The method of claim 15, wherein the process temperature of the first and second HDP processes determine the value of the first HDP process bias RF power and the second HDP process bias RF power.

27. The method of claim 15, wherein the structure is a silicon substrate.

28. A method of forming a composite dielectric layer, comprising the steps of:

providing a structure having at least two semiconductor structures separated by a gap therebetween;

forming a first dielectric layer over the structure, the two semiconductor structures and within the gap between the two semiconductor structures to a thickness as least as high as the top of the semiconductor structures by a first high density plasma (HDP) process; the first HDP process having a first high bias RF power, a low first deposition: sputter ratio and a first chucking bias voltage; and forming a second dielectric layer over the first dielectric layer by a second HDP process to form the composite dielectric layer; the second HDP process having: a second bias RF power that is less than the first bias RF power; a second deposition: sputter ratio that is greater than the first deposition: sputter ratio; and a second chucking bias voltage that is zero; wherein the first and second dielectric layers are comprised of the same material selected from the group consisting of PSG and USG.

29. The method of claim 28, wherein the second dielectric layer has a thickness sufficient to permit a subsequent planarization of the second dielectric layer; and including the step of planarizing the second dielectric layer to form a planarized composite dielectric layer.

30. The method of claim 28, wherein the second dielectric layer has a thickness sufficient to permit a subsequent chemical mechanical polishing planarization of the second dielectric layer; and including the step of planarizing the second dielectric layer by chemical mechanical polishing to form a planarized composite dielectric layer.

31. The method of claim 28, wherein the first and second HDP processes are conducted at the same temperature.

32. The method of claim 28, wherein the first HDP process is conducted at: a deposition rate of from about 3060 to 3740 Å/minute; a bias RF power of from about 2250 to 2750 W; a chucking bias voltage of from about 855 to 1045V; and a process temperature of from about 470 to 570° C.; and the second HDP process is conducted at: a deposition rate of from about 4230 to 5170 Å/minute; a bias RF power of from about 810 to 990 W; a zero chucking bias voltage; and a process temperature of from about 470 to 570° C.

33. The method of claim 28, wherein the first HDP process is conducted at: a deposition rate of about 3400 Å/minute; a bias RF power of about 2500 W; a chucking bias voltage of about 950V; and a process temperature of about 520° C.; and the second HDP process is conducted at: a deposition rate of about 4700 Å/minute; a bias RF power of about 900 W; a zero chucking bias voltage; and a process temperature of from about 520° C.

34. The method of claim 28, wherein the first HDP process is conducted at: a deposition rate of from about 3060 to 3740 Å/minute; a bias RF power of from about 2250 to 2750 W; a chucking bias voltage of from about 855 to 1045V; and a process temperature of from about 470 to 570° C. to form the first dielectric layer having a thickness of from about 1800 to 2200 Å; and the second HDP process is conducted at: a deposition rate of from about 4230 to 5170 Å/minute; a bias RF power of from about 810 to 990 W; a zero chucking bias voltage; and a process temperature of from about 470 to 570° C. to form the second dielectric layer having a thickness of from about 6750 to 8250 Å.

35. The method of claim 28, wherein the first HDP process is conducted at: a deposition rate of about 3400 Å/minute; a bias RF power of about 2500 W; a chucking bias voltage of about 950V; and a process temperature of about 520° C. to form the first dielectric layer having a thickness of about 2000 Å; and the second HDP process is conducted at: a deposition rate of about 4700 Å/minute; a bias RF power of about 900 W; a zero chucking bias voltage; and a process temperature of from about 520° C. to form the second dielectric layer having a thickness of about 7500 Å.

36. The method of claim 28, wherein the first dielectric layer is from about 1800 to 2200 Å thick and the second dielectric layer is from about 6750 to 8250 Å thick.

37. The method of claim 28, wherein the first dielectric layer is about 2000 Å thick and the second dielectric layer is about 7500 Å thick.

38. The method of claim 28, wherein the first and second dielectric layers are comprised of PSG.

39. The method of claim 28, wherein the process temperature of the first and second HDP processes determine the value of the first HDP process bias RF power and the second HDP process bias RF power.

40. The method of claim 28, wherein the structure is a silicon substrate.

* * * * *